(12) United States Patent
Takeda et al.

(10) Patent No.: US 7,654,712 B2
(45) Date of Patent: Feb. 2, 2010

(54) LAMP FOR VEHICLE

(75) Inventors: Hitoshi Takeda, Shizuoka (JP); Tsukasa Tokida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 3 days.

(21) Appl. No.: 11/768,954

(22) Filed: Jun. 27, 2007

(65) Prior Publication Data

US 2008/0013329 A1    Jan. 17, 2008

(30) Foreign Application Priority Data

Jun. 28, 2006   (JP)   .............................. 2006-177612

(51) Int. Cl.
*B60Q 1/00* (2006.01)

(52) U.S. Cl. ....................... 362/459; 362/545; 362/800; 362/248; 362/240; 313/494; 313/543; 313/546

(58) Field of Classification Search ................. 362/459, 362/546, 543, 545; 313/500–502, 494
See application file for complete search history.

(56) References Cited

U.S. PATENT DOCUMENTS 4,733,335 A * 3/1988 Serizawa et al. ............ 362/503

5,549,323 A * 8/1996 Davis ....................... 280/728.3
5,833,355 A * 11/1998 You et al. .................... 362/244
6,953,265 B2 * 10/2005 Suehiro et al. .............. 362/241

FOREIGN PATENT DOCUMENTS

JP    2001-266620 A    9/2001
JP    2004-362840 A    12/2004

* cited by examiner

*Primary Examiner*—Sandra L O'Shea
*Assistant Examiner*—Jessica L McMillan
(74) *Attorney, Agent, or Firm*—Sughrue Mion, PLLC

(57) ABSTRACT

A lamp module is constructed of a light source part made of a semiconductor light emitting element, and an optical member for distributing light emitted from the light source part. The light source part includes a surface-emitting laser element in which plural light emission parts are parallel arranged on a surface, a mask which is disposed on a surface of the surface-emitting laser element and includes plural mask openings for exposing the light emission parts, and fluorescent substances with which the mask openings are filled. By forming the light source part in a monolithic configuration, an array pitch of the plural light emission parts can be decreased, a light source can be miniaturized and also a lamp can be further miniaturized.

13 Claims, 7 Drawing Sheets

LAMP FOR VEHICLE

This application claims priority from Japanese Patent Application No. 2006-177612, filed Jun. 28, 2606, in the Japanese Patent Office, to content of which is incorporated by reference in its entirety.

TECHNICAL FIELD

The present disclosure relates to a lamp for a vehicle using a semiconductor light emitting element such as a light emitting diode (LED) or a laser diode (LD) as a light source, and particularly, to a compact and lightweight lamp for a vehicle, capable of obtaining required luminous intensity and light distribution characteristics.

RELATED ART

In recent years, semiconductor light emitting elements such as an LED or an LD have been used as a light source used in an automobile lamp, and a part of the elements have been also used as a light source of a headlight (headlamp). For example, in Japanese Patent Unexamined Publication No. 2004-362840, a light source unit is constructed by arranging plural semiconductor light emitting chips on a front surface of a substrate in a matrix state. In this light source unit, in order to prevent interference of light between the adjacent semiconductor light emitting chips, a perforated plate having holes for exposing each of the semiconductor light emitting chips is disposed on the front surface of the substrate as a mask member, and also, each of the holes is filled with a transparent mold resin for covering the semiconductor light emitting chips. A translucent plate for functioning as a condensing lens is disposed in the front of the light source unit and required light distribution characteristics are obtained by this translucent plate.

Also, in Japanese Patent Unexamined Publication No. 2001-266620, a light source is constructed by arranging multiple discrete type light emitting elements in a matrix state. A part of the light emitted from the light source is blocked by a diaphragm and the light passing through the diaphragm is condensed by an optical lens and required light distribution characteristics are obtained.

In the light source of 2004-362840, plural semiconductor light emitting chips are mounted on the front surface of the substrate in the matrix state, so that when the number of semiconductor light emitting chips is increased in order to improve luminous intensity of the light source, the number of man-hours necessary to mount the semiconductor light emitting chips increases and also it is difficult to mount the adjacent semiconductor light emitting chips in a predetermined position of the substrate and in a predetermined optical axis direction. Particularly, a required spacing (pitch) between the adjacent semiconductor light emitting chips must be ensured in order to mount the semiconductor light emitting chips, and as a result, it is difficult to decrease a pitch dimension and difficult to miniaturize the light source, that is, a lamp. Also, the mask member is present between the adjacent semiconductor light emitting chips and a region in which light is not emitted is generated, so that it becomes a cause of generating unevenness in luminous intensity in light distribution characteristics. Further, in 2004-362840, it is configured to transmit the mold resin and emit light emitted by the semiconductor light emitting chips to the front, so that the amount of light emitted may reduce due to light absorption in the mold resin.

The light source of 2001-266620 is similar to that of 2004-362840 and when the number of light emitting elements is increased, the number of man-hours necessary to form the light source increases. Also, in 2001-266620, the light emitting elements can be closely arranged and a mask is not used, so that it is effective in suppressing unevenness in luminous intensity in light distribution characteristics, but the discrete type light emitting element has a size larger than that of a chip type light emitting element, so that the light source becomes larger. Also, since a mask member is not present between the adjacent light emitting elements, when only a part of the light emitting elements is emitted, the light emitted from the light emitting elements in which light is emitted may be leaked into the side of the light emitting elements in which light is not emitted. As a result, even in the case of attempting to obtain desired light distribution characteristics by individually controlling light emission of the light emitting elements, it is difficult to control an illumination region by each of the light emitting elements with high accuracy and it may be difficult to obtain intended light distribution characteristics.

SUMMARY

Exemplary embodiments of the present invention provide a lamp for a vehicle capable of easily obtaining desired light distribution characteristics while achieving miniaturization.

In an exemplary embodiment of the present invention, a light source part comprises a semiconductor light emitting element, and an optical member for distributing light emitted from the light source part, and the light source part comprises a planar integrated light source having plural light emission parts arranged in a plane on a surface, a mask which is disposed on a surface of the planar integrated light source and comprises plural openings for exposing the light emission parts, and fluorescent substances with which the openings of the mask are filled. Here, the planar integrated light source in exemplary embodiments of the present invention refers to a light source in which the plural light emission parts are monolithically formed on a semiconductor substrate. Here, in exemplary embodiments of the present invention, an inner wall of the opening of the mask is preferably inclined so that an opening diameter increases toward the front side. Further, a surface of the inner wall may be treated reflectively.

Exemplary embodiments of the present invention may exhibit one or more the following advantages. For example, according to exemplary embodiments of the present invention, a light source is constructed of a planar integrated light source in which plural light emission parts are arranged in a plane, that is, a monolithic semiconductor light emitting element, so that an array pitch of the plural light emission parts can be decreased and the light source can be miniaturized and also a lamp can be miniaturized. Furthermore, light emitted from each of the light emission parts does not leak into adjacent regions due to a mask arranged on the front of the planar integrated light source, and even in the case of performing control so as to selectively emit light from the light emission parts, desired light distribution characteristics can be obtained. Further, an opening of the mask in which the light emission parts are arranged is filled with a fluorescent substance and the fluorescent substance emits light by light emitted from the light emission parts, so that the amount of light is increased, and also, a situation in which a region in which light is not emitted is generated between the light emission parts is solved by emitting light emitted by the fluorescent substance between the adjacent light emission parts, and unevenness in luminous intensity does not occur.

Other features and advantages may be apparent from the following detailed description, the accompanying drawings and the claims.

DETAILED DESCRIPTION

In an aspect of the present invention, a lamp for a vehicle includes an optical member comprising a control circuit which is constructed integrally with a light source part and can selectively emit light of plural light emission parts. The need for a light blocking member for obtaining required light distribution characteristics is eliminated, and miniaturization and simplification of a structure of the lamp can be achieved.

In another aspect of the present invention, in a lamp for a vehicle, a front edge of an inner wall forming the boundary between adjacent openings is formed in a sharp sectional shape in a mask. A continuous light emission region without discontinuity in a light emission region from the adjacent openings is formed, and also, the boundary between the adjacent light emission region and a non-light emission region becomes definite and it becomes effective in obtaining any light distribution patterns.

First Exemplary Embodiment

Figure 1:
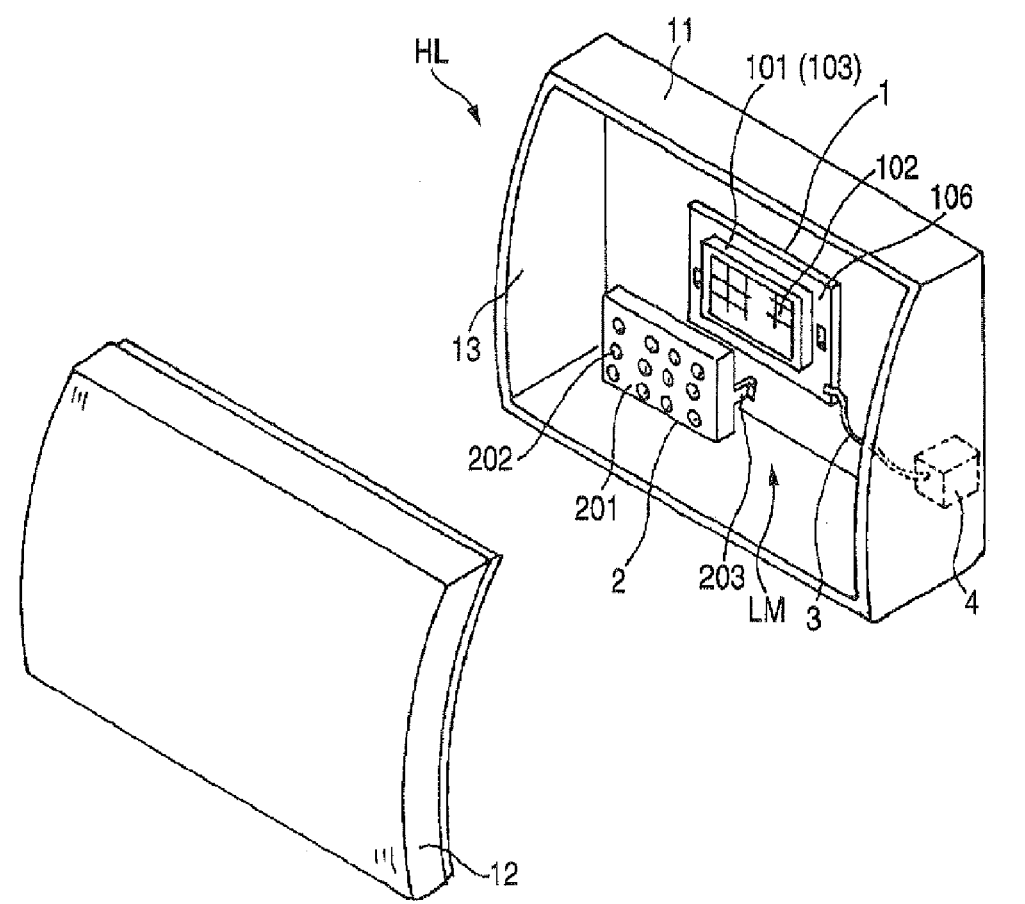
FIG. 1 is a schematic perspective view of a part of a headlamp of a first exemplary embodiment.
Figure 2:
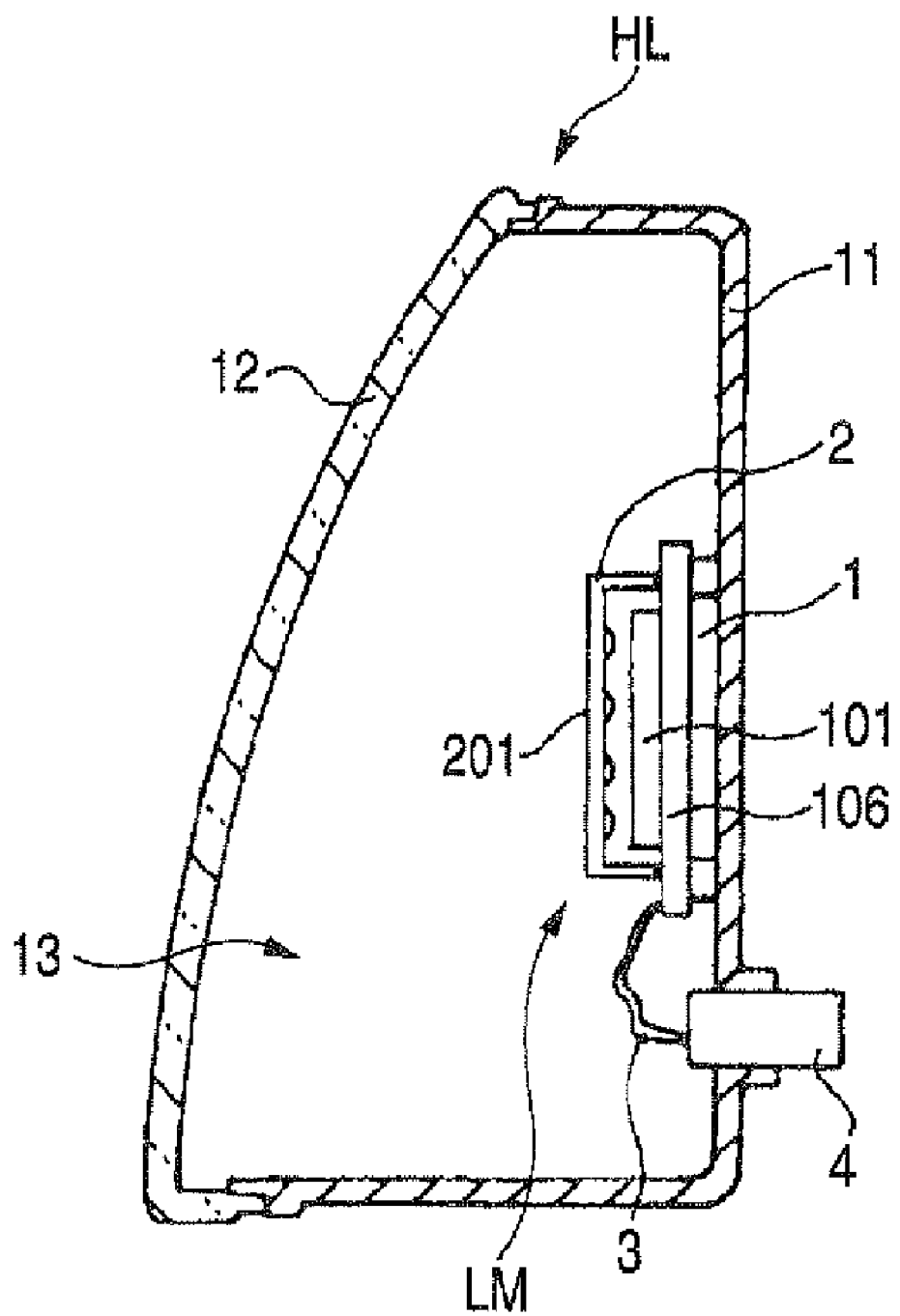
FIG. 2 is a longitudinal sectional view of the headlamp of the first exemplary embodiment.

Next, exemplary embodiments of the present invention will be described with reference to the drawings. FIG. 1 is a partially exploded perspective view showing a schematic configuration of an exemplary embodiment in which the present invention is applied to a headlamp HL disposed in the right and left of the front of an automobile, and FIG. 2 is a longitudinal sectional view along an optical axis. A lamp chamber 13 is constructed of a shallow dish-shaped lamp body 11 with a required front shape and a transparent cover 12 attached to a front opening of this lamp body 11, and a light source part 1 and an optical member 2 are disposed inside this lamp chamber 13. In this exemplary embodiment, the light source part 1 and the optical member 2 are constructed as a lamp module LM. The lamp module LM is integrally provided with a lighting control circuit (not shown), and is constructed so that lighting of the lamp module LM is controlled based on a signal from an ECU (electronic control unit) (not shown) installed in the automobile.

Figure 3:
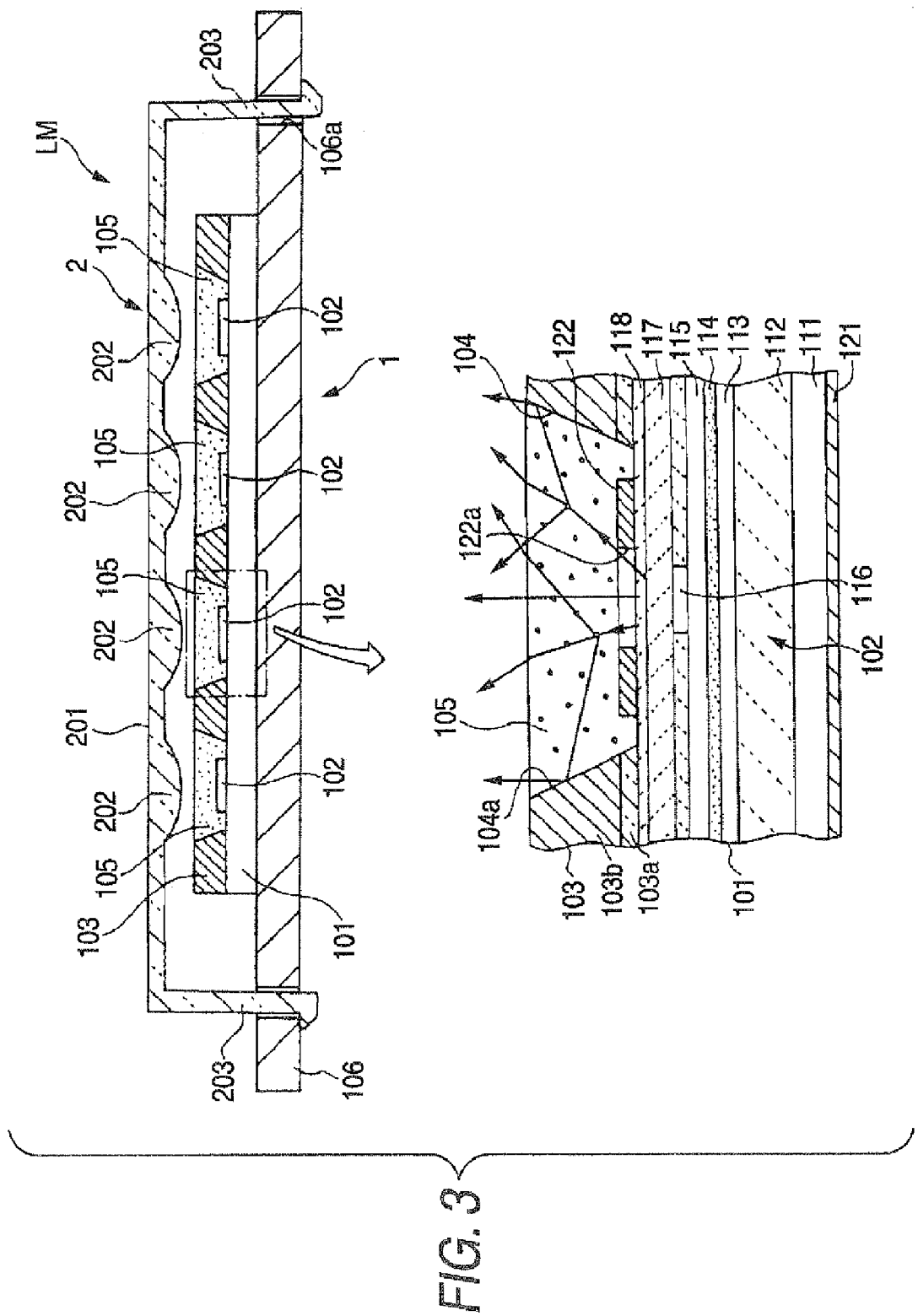
FIG. 3 is an enlarged sectional and exploded view of a part of a light source module.

FIG. 3 is an enlarged sectional view along an optical axis direction of the lamp module LM. The light source part 1 comprises a planar integrated light source 101 with a required planar shape and a monolithic configuration in which plural light emission parts 102 are formed with the light emission parts arranged on a surface in a matrix state in planar XY directions, and the planar integrated light source 101 is herein constructed as a surface-emitting laser element. Since an element structure of this surface-emitting laser element 101 may be a known structure, detailed description is omitted, and for example, a lower mirror layer 112 is formed on a sapphire substrate or a GaN substrate 111, and on this mirror layer 112, a spacer layer 113, an active layer 114, a spacer layer 115, a current narrow layer 116, an upper mirror layer 117 and a contact layer 118 are formed as the light emission part 102. Then, a lower contact electrode 121 is formed on a lower surface of the GaAs substrate 111 and an upper contact electrode 122 is formed on the contact layer 118 of the upper layer and an opening window 122a is formed in the upper contact electrode 122. When a current is applied between the lower and upper contact electrodes 121, 122 in this surface-emitting laser element, the current injected from the upper contact electrode 122 is injected into the active layer 114 through the current narrow layer 116 and blue light to ultraviolet light is generated in the active layer 114. The generated light is resonated by an optical resonator made of the lower and upper mirror layers 112, 117 and is emitted in a direction perpendicular to a surface of the element from the opening window 122a of the upper contact electrode 122. The lower contact electrode 121 is constructed as a common electrode in the plural light emission parts 102, but the upper contact electrodes 122 of each of the light emission parts 102 are formed in patterns capable of applying currents respectively independently and are electrically connected to the lighting control circuit respectively independently.

A mask 103 with a required film thickness is integrally formed on a surface of the light source 1, that is, the surface-emitting laser element 101. This mask 103 is formed by material in which light is not transmitted, and for example, may include a thin insulating film 103a and a thick metal film (aluminum film 103b herein) which are sequentially evaporated. In addition, by a photolithography technique, selective etching of the aluminum film 103b is performed and a region including the light emission part 102 is etched and removed in a circle, and further, the insulating film 103a of the lower layer is etched and removed and a mask opening 104 is opened. At this time, by performing wet etching (isotropic etching) of the aluminum film 103b, an inner wall 104a is formed in an inclined taper shape so that a diameter size increases in a surface direction in the opened mask opening 104. Also at the same time, a raw material surface of aluminum is exposed, so that the inner wall 104a of the mask opening 104 is formed as a light reflective surface. The mask 103 constructed thus is means disposed so that a region other than the light emission parts 102 of the surface-emitting laser element 101 is covered and also prevents a situation in which light emitted from the light emission parts 102 leaks into the adjacent light emission parts 102 influencing light distribution characteristics.

Further, the inside of the mask opening 104 is filled with a transparent resin into which a fluorescent material is mixed as a fluorescent substance 105. A material for emitting yellow light having a complementary color relation to a range of blue light to ultraviolet light by receiving blue to ultraviolet light emitted by each of the light emission parts 102 of the surface-emitting laser element is used as this fluorescent material. This fluorescent substance 105 is formed by flatly polishing a surface of the fluorescent substance 105 so as to be flush with a surface of the mask 103 after filling the inside of the mask opening 104.

The light source part 1, that is, the surface-emitting laser element 101 is installed in a circuit substrate 106, and the lower contact electrode 121 is directly connected to a conductive pattern formed on a surface of the circuit substrate 106, and the upper contact electrodes 122 of each of the light emission parts 102 are electrically connected to the circuit substrate 106 by lead wire (not shown), respectively. In addition, in an exemplary embodiment, since the light emission parts 102 are arranged in a matrix state in planar XY directions, for example, it may be constructed so that each of the upper contact electrodes 122 of the light emission parts 102 arranged in the X direction extends in the X direction and is electrically connected to the circuit substrate 106 in each of the extension ends. This circuit substrate 106 partially constructs the lighting control circuit (not shown).

Further, the optical member 2 is attached to a surface of the circuit substrate 106 so as to cover the surface-emitting laser element 101. This optical member 2 has a plate-shaped lens body 201 in which a transparent resin is molded, and is attached by fitting hook pieces 203 disposed in both ends of this lens body 201 into engagement holes 106a disposed in the circuit substrate 106. In the lens body 201, plural microlenses 202 are integrally formed on the front faces of each of the light emission parts 102 of the light source part 1. These microlenses 202 are respectively disposed in a matrix state on the front of the lens body 201 so that the optical axis of each of the light emission parts 102 of the light source part 1, in other words, the center of the mask opening 104 matches with the lens optical axis. Also, in an exemplary embodiment, a distance from the lens body 201 to the light source part 1 is set so that focal points of the microlenses 202 substantially match with laser light emission points of each of the light emission parts 102.

The lamp module LM described above is inward packaged and supported inside the lamp chamber 13 of the lamp body 11 as shown in FIGS. 1 and 2. The lamp module LM is fixed in an inner surface of a back wall of the lamp body 11 by, for example, a screw. An electric cord 3 is connected to the circuit substrate 106 and is connected to a connector 4 disposed in the lamp body 11. A cord connected to the ECU installed in the automobile can be connected to this connector 4. Then, the lighting control circuit disposed in the circuit substrate 106 selectively or collectively controls light emission of plural light emission parts 102 of the light source part 1 based on an electrical signal from the ECU. In the light emission in the light emission parts 102, laser light emitted in the active layer 114 is emitted in a luminous flux shape of a circle from the opening window 122a toward an optical axis direction of the light emission part 102, that is, a direction substantially perpendicular to a surface of the surface-emitting laser element as shown in FIG. 3. The emitted laser light passes through the fluorescent substance 105 with which the mask opening 104 is filled, and is emitted in a state somewhat refracted or substantially straight along the optical axis from a surface of this fluorescent substance 105. At the same time, a part of blue to ultraviolet light emitted from the light emission part 102 is applied to a fluorescent material of the fluorescent substance 105 and yellow fluorescence is generated in the fluorescent material. A part of the generated fluorescence passes through the fluorescent substance 105 and is directly emitted from its surface, and the other part is applied to the inner wall 104a of the mask opening 104 and is reflected hereon and then is emitted from the surface of the fluorescent substance 105.

Thus, laser light of blue to ultraviolet light emitted through the mask opening 104 by emitting light in each of the light emission parts 102 of the light source part 1 and yellow fluorescence generated in the fluorescent substance 105 by receiving the laser light are respectively added and mixed and result in white light, and the white light is condensed by each of the microlenses 202 of the lens body 201 and is emitted along substantially the optical axis. Then, the area in front of the automobile is irradiated through the transparent cover 12 of the headlamp HL and illumination as the headlamp HL is performed. In this headlamp HL, laser light generated and emitted in the light source part 1 is emitted while spreading at some angle along the optical axis of the headlamp HL, and fluorescence generated in the fluorescent substance 105 is emitted while spreading at an angle greater than its angle, and the laser light and the fluorescence respectively illuminate the area in front of the automobile. Since the fluorescence generated in the fluorescent substance 105 is emitted in a region wider than that of the laser light, even when a region in which the laser light is not emitted is present between the adjacent light emission parts 102 in the light source part 1, this region can be complemented by the fluorescence and illumination at an even and uniform luminous intensity. Also, luminous intensity of the whole illumination region can be increased by superimposing the laser light on the fluorescence.

Figure 4A:
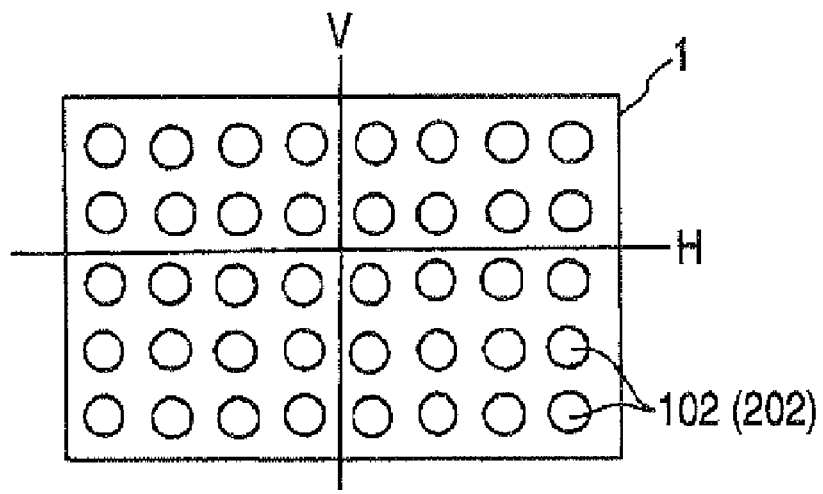
FIGS. 4A, 4B are front views of a light source part describing light distribution patterns in the first exemplary embodiment.
Figure 4B:
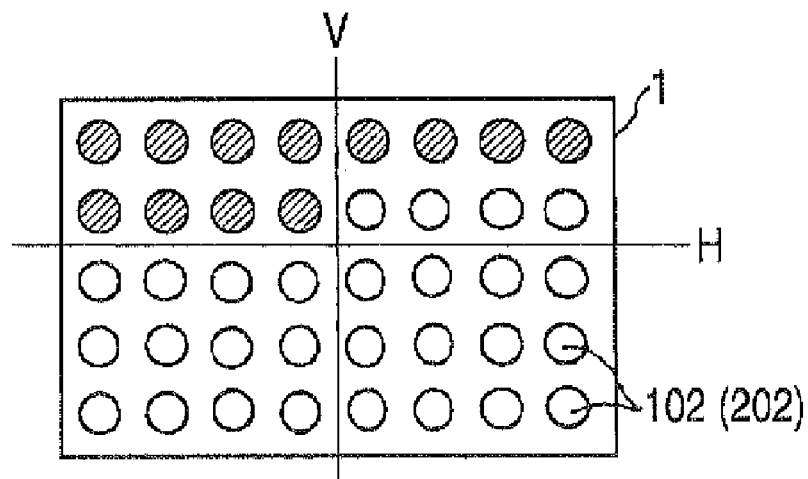

Setting to any light distribution patterns can be made by emitting light by selecting the light emission part of the light source part in the lighting control circuit. For example, as shown in FIG. 4A, in a case of emitting light of all the light emission parts 102, setting to a high-beam light distribution pattern for illuminating a required region including the optical axis of the headlamp HL can be made. On the other hand, as shown in FIG. 4B, setting to a low-beam light distribution pattern for illuminating a side region lower than the optical axis of the headlamp HL can be made by emitting light in only a part of the light emission parts 102 and stopping light emission in the other light emission parts 102. In addition, FIGS. 4A and 4B are schematic diagrams in a case of viewing the lamp module LM from a front direction, and in the diagrams, line H is a horizontal reference line and line V is a vertical reference line, and the intersection of these reference lines is the optical axis. Also, in each of the light emission parts, a white region is a region in which light is emitted, and a region blacked out is a region in which light is not emitted. Therefore, the lighting control circuit receives a beam switching signal by operation of a driver and controls light emission of each of the light emission parts 102 of the light source part 1, and thereby, the setting to the high-beam light distribution pattern and the low-beam light distribution pattern can be made. Of course, it goes without saying that setting to other light distribution patterns can be made.

Thus, in the headlamp of an exemplary embodiment, the lamp module LM is constructed of the light source part 1 and the optical member 2, and the light source part 1 is mainly constructed of the monolithic surface-emitting laser element 101. Also the mask 103 for controlling a direction of light emitted from the light emission parts 102 is integrally formed in the surface-emitting laser element 101, so that plural light emission parts 102 can be simultaneously formed when the surface-emitting laser element 101 is manufactured by a semiconductor manufacturing technique. As a result, it is easy to decrease an array pitch of the plural light emission parts 102 and the light source part 1 can be miniaturized and also the need for a step of assembling the plural light emission parts 102 is eliminated and manufacture is facilitated and cost can be reduced. Also, the lamp module LM can be constructed by only assembling the optical member 2 integrally with respect to the light source part 1, so that the lamp module LM can be miniaturized and thinned, and miniaturization and thinning of the headlamp HL containing this lamp module LM can be achieved. Further, it is unnecessary to dispose any light distribution control means such as a shade inside the headlamp HL in order to switch a light distribution pattern, and it is effective in simplifying a configuration of the headlamp HL and achieving further miniaturization.

Second Exemplary Embodiment

Figure 5:
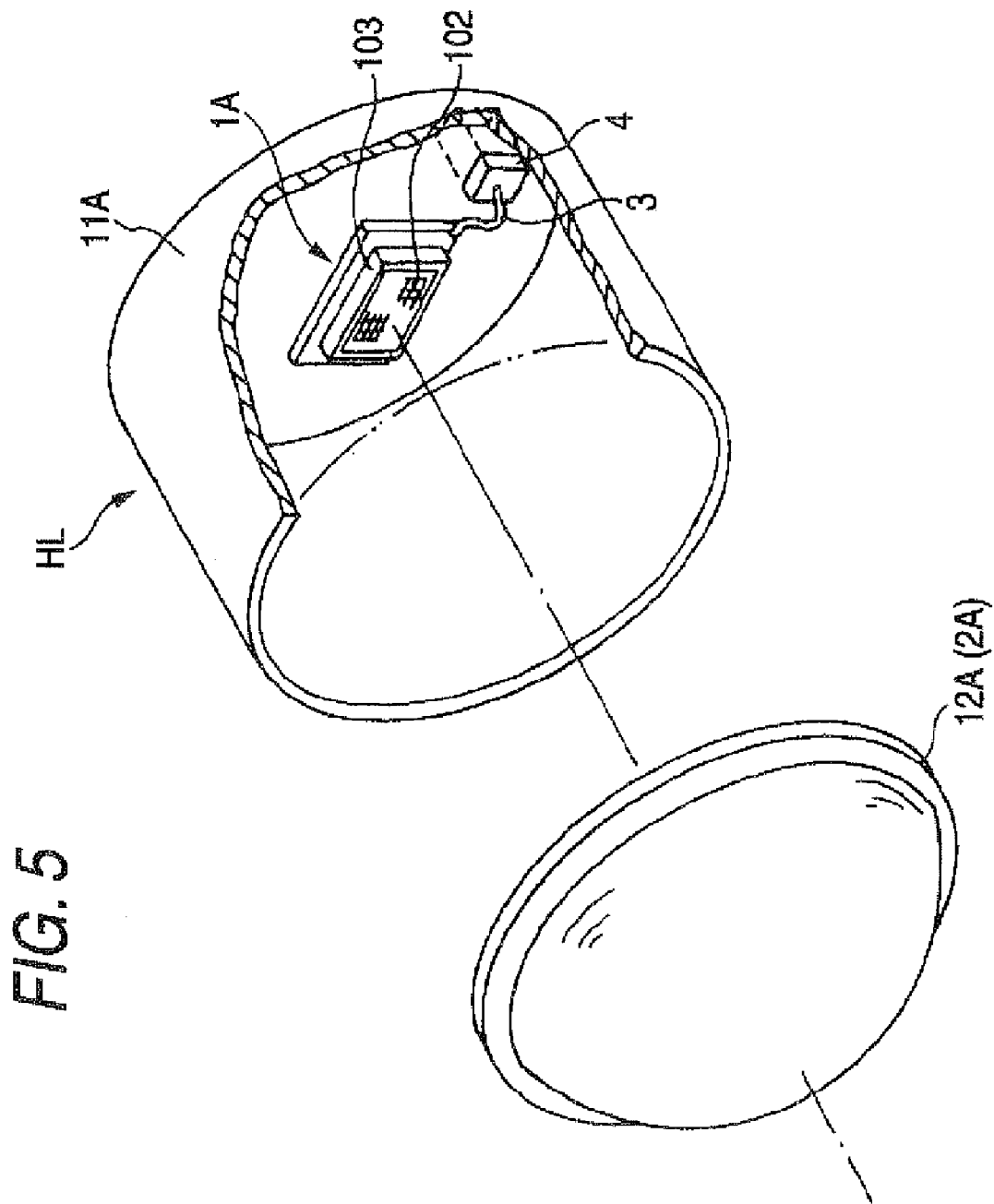
FIG. 5 is a partially exploded perspective view of a headlamp of a second exemplary embodiment.

FIG. 5 is an exploded perspective view showing a schematic configuration of a headlamp HL of another exemplary embodiment. This exemplary embodiment is constructed as a projector type lamp, and a lamp body 11A is formed in a cylindrical container shape and a light source part 1A is disposed in the bottom of the lamp body 11A. Also, a projection lens 12A with condensing properties as an optical member 2A is disposed in a front opening. Since a configuration of the light source part 1A is of a similar configuration as a light source part 1 of the first exemplary embodiment, the description is omitted. Also, the lens body 201 comprising the microlenses as shown in the first exemplary embodiment is not disposed integrally with respect to the light source part 1A and a lamp module is not constructed. Then, in the second exemplary embodiment, the projection lens 12A is constructed as an optical member according to exemplary embodiments of the present invention.

Figure 6A:
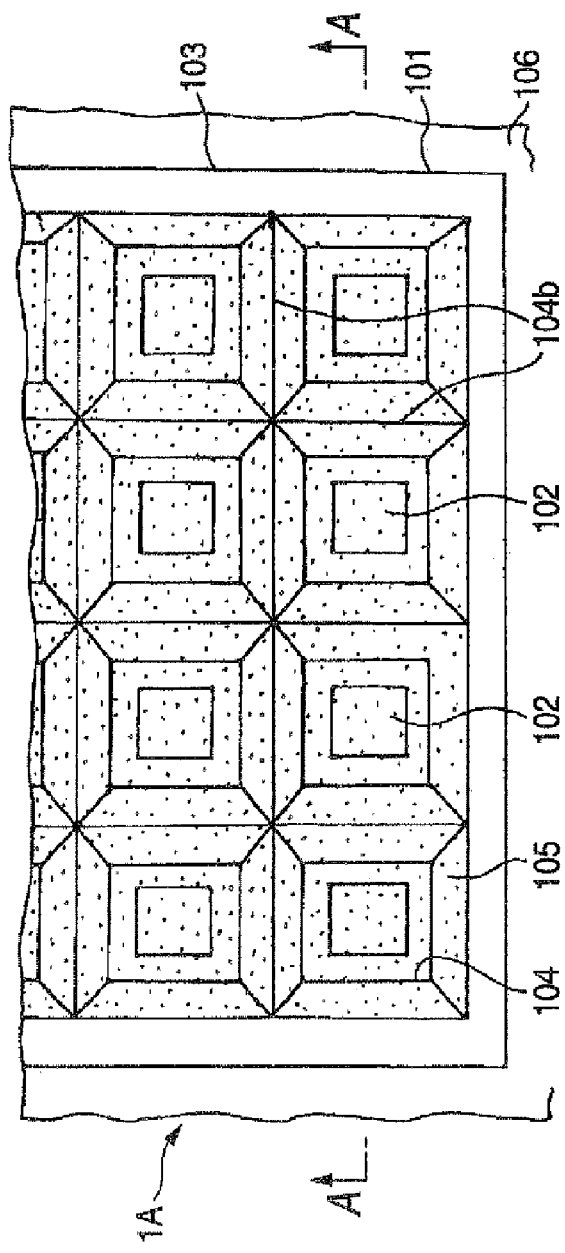
FIGS. 6A, 6B are plan views of a light source part of the second exemplary embodiment and a sectional view taken on line A-A of the plan view.
Figure 6B:
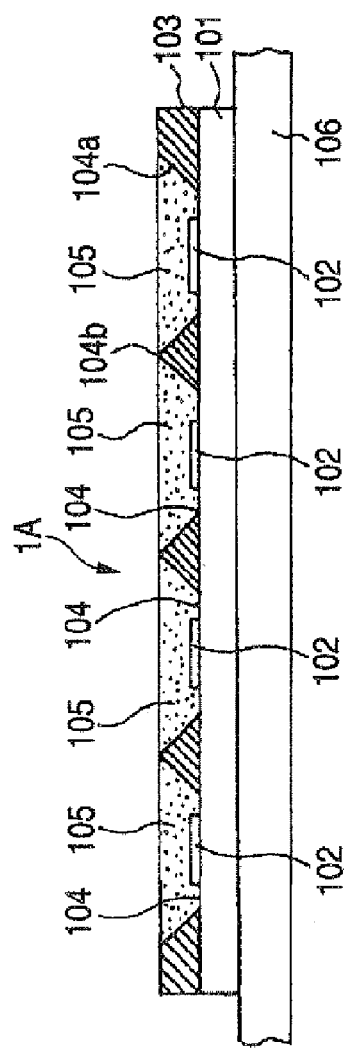

A mask 103 for covering light emission parts 102 of the light source part 1A is constructed so that an inclination angle of an inner wall 104a of a mask opening 104 is increased and front edges 104b of each of the inner walls 104a of the adjacent mask openings 104 have a sharp shape like a triangular ridge and the adjacent mask openings 104 mutually abut on the front of the mask 103 as shown in a front view in FIG. 6A and a sectional view taken on line A-A of FIG. 6A in FIG. 6B, respectively. By being constructed thusly, a flat planar region of the mask 103, that is a region in which light is not emitted, is not present between the mask openings 104, a non-light emission region is not present between adjacent light emission regions, and the continuous light emission regions can be constructed. On the other hand, when one of the adjacent light emission regions does not emit light, the boundary between the light emission region and the non-light emission region can be defined. Also at the same time, capacity of the mask opening 104 increases and volume of a fluorescent substance 105 with which the mask opening 104 is filled increases and the amount of light emission by fluorescence can be increased.

Figure 7A:
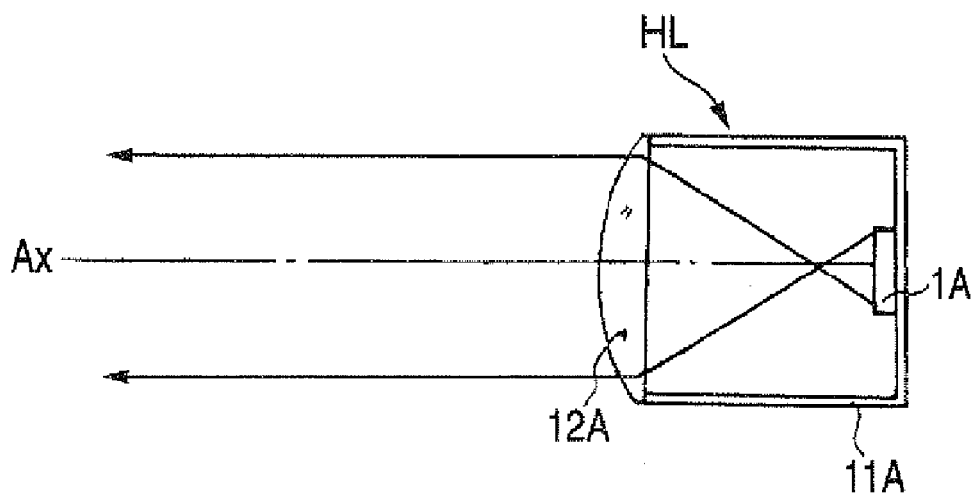
FIGS. 7A, 7B are schematic sectional views describing light distribution patterns in the second exemplary embodiment.
Figure 7B:
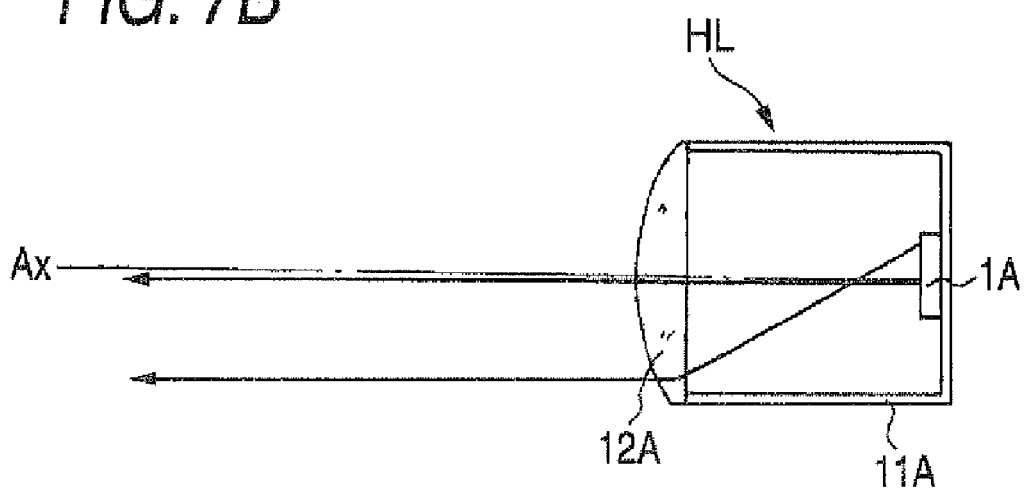

In the headlamp HL of the second exemplary embodiment, light emitted from the light emission parts 102 is refracted by the projection lens 12A and illuminates a front region of the headlamp HL. In a high-beam light distribution pattern, as shown in FIG. 7A, by emitting light of all the light emission parts 102, almost all the light emitted from each of the light emission parts 102 of the light source part 1A enters the projection lens 12A as is and is condensed in the projection lens 12A, and illumination in a required high-beam light distribution pattern is performed. In a low-beam light distribution pattern, as shown in FIG. 7B, by emitting light of the light emission parts 102 of about a half region above the optical axis Ax of the light source part 1A, the light condensed in the projection lens 12A illuminates a region below the optical axis Ax of the headlamp HL, and illumination in a required low-beam light distribution pattern is performed.

In the headlamp HL of the second exemplary embodiment, the light source part 1A is only constructed of a simply monolithic surface-emitting laser element 101, the mask 103 formed on a surface of the element 101 and the fluorescent substance 105 with which the mask opening 104 is filled, and the optical member as shown in the first exemplary embodiment is not disposed integrally, so that the light source part 1A can be constructed smaller and thinner than the light source part 1 of the first exemplary embodiment and also can be manufactured by using only a manufacturing process for manufacturing a semiconductor integrated apparatus, so as to reduce cost. Also, the front edges 104b of the mask openings 104 are formed in a sharp shape and the non-light emission region is not caused between the adjacent light emission regions. Also, the boundary between the adjacent non-light emission region and the light emission region can be defined, so that a required light distribution pattern can easily be obtained by only condensation by the projection lens 12A.

In the second exemplary embodiment, the example of constructing a light source of the headlamp HL of only the light source part 1A has been shown, but the lamp module LM of the first exemplary embodiment may be used as a light source of the second exemplary embodiment. In this case, it goes without saying that the optical member according to the exemplary embodiments of present invention are constructed as an optical member with a double configuration of a lens body acting as the optical member constructing the lamp module LM and the projection lens 12A attached to a front opening of the lamp body 11A.

Also, the material used in constructing the mask 103 is not limited to aluminum in exemplary embodiments, and can also be formed by using resin or other materials. For example, the mask 103 can also be formed using a resin containing carbon black. In this case, in order to construct an inner surface of the inner wall 104a of the mask opening 104 as a reflective surface, it may be constructed so as to perform reflection treatment by, for example, evaporating aluminum or another material on the inner surface.

Also, in the exemplary embodiments, examples of the surface-emitting laser element as a light emitting element for constructing a light emitting part of a planar integrated light source has been shown, but a light emitting element capable of being constructed monolithically may be used and may be constructed of, for example, a surface-emitting diode element. Also, the light source part of exemplary embodiments of the present invention may be constructed of plural planar integrated light sources and may be constructed so that the light source part is constructed by forming each of the planar integrated light sources respectively independently or integrally and is inward packaged inside a lamp body.

The invention is not limited to the headlamps of the exemplary embodiments, and can also be applied to a marker lamp or an auxiliary lamp of a vehicle. Also, the present invention can be applied to a combination lamp in which plural lamps are integrated.

While the invention has been described with respect to a limited number of exemplary embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A lamp for a vehicle, comprising:
a light source part comprising a planar integrated light source; and
an optical member which distributes light emitted from the light source part, wherein the planar integrated light source comprises
a plurality of light emission parts arranged in a plane on a surface of the planar integrated light source;
a mask which is disposed on the surface of the planar integrated light source and comprises a plurality of openings which expose the light emission parts; and a fluorescent substance with which the openings of the mask are filled.

2. A lamp as claimed in claim 1, wherein inner walls of the openings of the mask are inclined so that an opening diameter increases toward a front side of the mask.

3. A lamp as claimed in claim 2, wherein front edges of the inner walls forming the boundaries between adjacent openings have a sharp sectional shape in the mask.

4. A lamp as claimed in claim 3, wherein surfaces of the inner walls are treated to become reflective.

5. A lamp as claimed in claim 2, wherein surfaces of the inner walls are treated to become reflective.

6. A lamp as claimed in claim 1, wherein the optical member comprises a control circuit which is constructed integrally with the light source part and can selectively emit light of the plurality of light emission parts.

7. A lamp as claimed in claim 6, wherein the control circuit can selectively emit light of any one of the plurality of light emission parts or any combination of ones of the plurality of light emission parts.

8. A lamp as claimed in claim 1, wherein the planar integrated light source comprises a semiconductor substrate in which the plural light emission parts are monolithically formed.

9. A lamp for a vehicle, comprising:
a light source part comprising a planar integrated light source, wherein the integrated light source comprises light emission parts disposed on the surface of the planar integrated light source;
an optical member that distributes light emitted from the light source part;
a mask comprising a plurality of openings which expose the light emission parts; and
a fluorescent substance disposed in the openings of the mask.

10. A lamp as claimed in claim 1, wherein the planar integrated light source comprises a surface emitting laser element.

11. A lamp as claimed in claim 10, wherein the surface emitting laser element source comprises:
a lower mirror layer;
an upper mirror layer; and
an active layer between the lower and upper mirror layers.

12. A lamp as claimed in claim 11, wherein the surface emitting laser element source further comprises:
an upper contact electrode; and
a lower contact electrode.

13. A lamp as claimed in claim 12, wherein the surface emitting laser element source further comprises:
a plurality of contact electrodes corresponding to the plurality of openings.

* * * * *